United States Patent
Son

(10) Patent No.: US 8,273,234 B2
(45) Date of Patent: Sep. 25, 2012

(54) METHOD FOR MANUFACTURING PCB AND PCB MANUFACTURED USING THE SAME

(76) Inventor: Kyung-Ai Son, Incheon (KR)

( * ) Notice: Subject to any disclaimer, the term of this patent is extended or adjusted under 35 U.S.C. 154(b) by 666 days.

(21) Appl. No.: 12/307,494

(22) PCT Filed: Jun. 28, 2007

(86) PCT No.: PCT/KR2007/003159
§ 371 (c)(1), (2), (4) Date: Jan. 5, 2009

(87) PCT Pub. No.: WO2008/004784
PCT Pub. Date: Jan. 10, 2008

(65) Prior Publication Data
US 2009/0308644 A1  Dec. 17, 2009

(30) Foreign Application Priority Data

Jul. 4, 2006 (KR) .................. 10-2006-0062487
Jun. 22, 2007 (KR) .................. 10-2007-0061432

(51) Int. Cl.
*C25D 5/02* (2006.01)
(52) U.S. Cl. ........................... 205/125; 205/170
(58) Field of Classification Search .............. 205/125, 205/170, 183
See application file for complete search history.

(56) References Cited

U.S. PATENT DOCUMENTS

| | | | | |
|---|---|---|---|---|
| 5,160,579 A | * | 11/1992 | Larson | 216/18 |
| 7,169,313 B2 | * | 1/2007 | Card et al. | 216/13 |
| 2003/0188886 A1 | * | 10/2003 | Fey et al. | 174/256 |

FOREIGN PATENT DOCUMENTS

| | | |
|---|---|---|
| JP | 16087862 A | 3/2004 |
| JP | 16172303 A | 6/2004 |
| KR | 1020050068032 | 7/2005 |

* cited by examiner

*Primary Examiner* — Luan Van
(74) *Attorney, Agent, or Firm* — John K. Park; Park Law Firm

(57) ABSTRACT

The present invention relates to a Printed Circuit Board (PCB), and, more particularly, to a printed circuit board in which a special-purpose dot circuit and an external circuit are simultaneously formed in order to improve electrical efficiency, for example by decreasing impedance and electromagnetic waves, and a method of manufacturing the same. The method of manufacturing a printed circuit board, including a copper clad laminate that includes an insulated substrate and a piece of copper foil applied on one side of the insulated substrate, includes the steps of (a) adhering a dry film including a photosensitizing agent on the copper foil, and then exposing and developing the dry film, thereby forming a dry film opening for forming a dot circuit, (b) forming a copper plating layer by performing electroless or electrolytic plating, and then stripping the dry film other than the copper plating layer, thereby forming a dot circuit, which is a first metal layer, (c) further adhering a dry film including a photosensitizing agent on the dot circuit, and exposing and developing the dry film, thereby forming an external circuit, and (d) forming a second metal layer by performing electroless or electrolytic plating in order to improve the conductivity of the dot circuit and external circuit.

6 Claims, 12 Drawing Sheets

Fig. 1 — Prior Art —
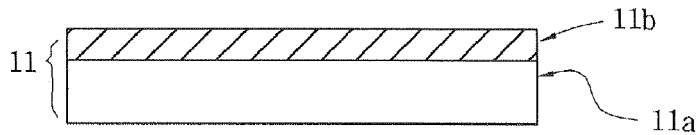
Fig. 2 — Prior Art —
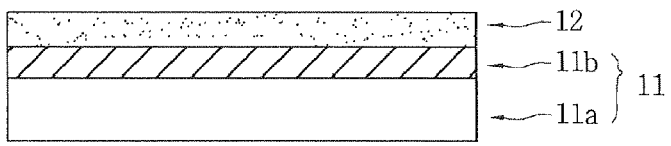
Fig. 3 — Prior Art —
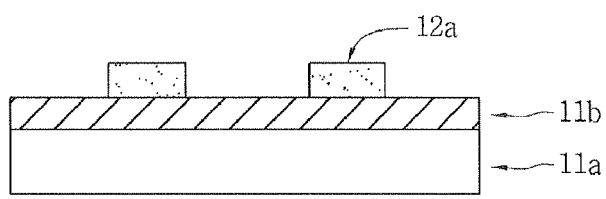
Fig. 4 — Prior Art —
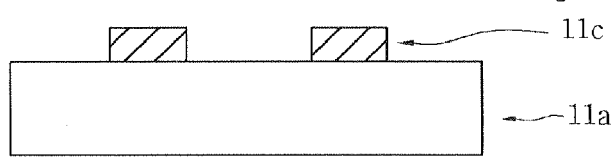
Fig. 5 — Prior Art —
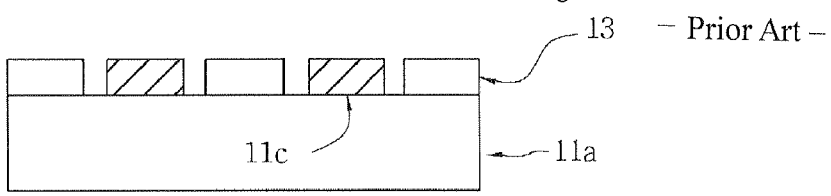
Fig. 6 — Prior Art —
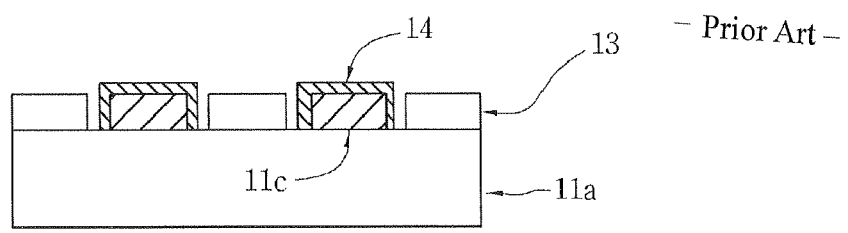
Fig. 7 — Prior Art —
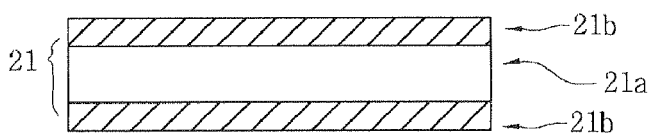

– Prior Art –

– Prior Art –

– Prior Art –

– Prior Art –

Fig. 12 — Prior Art —
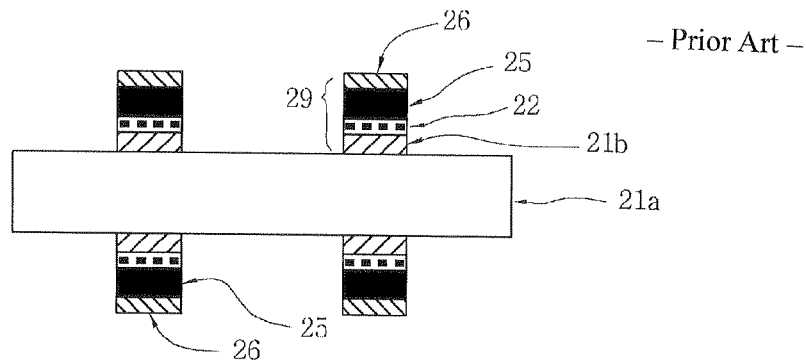
Fig. 13 — Prior Art —
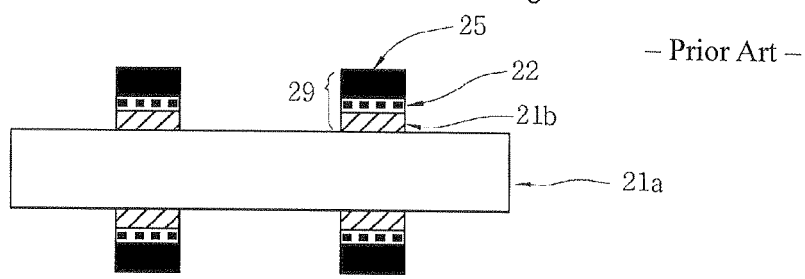
Fig. 14 — Prior Art —
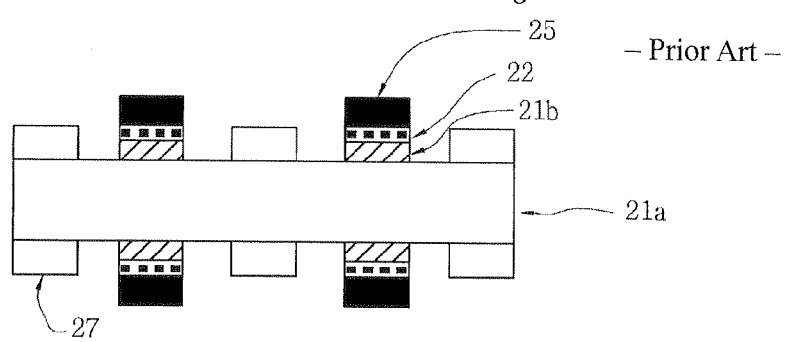
Fig. 15 — Prior Art —
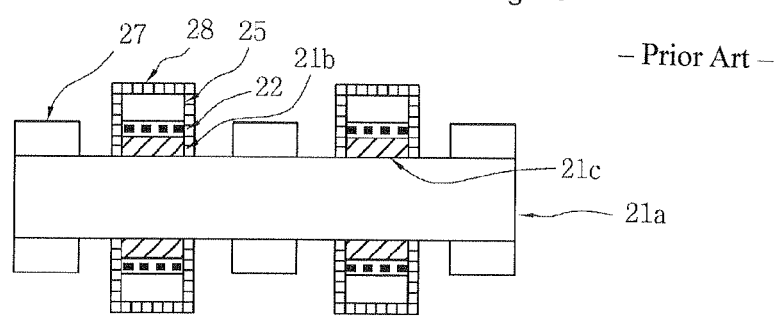
Fig. 16
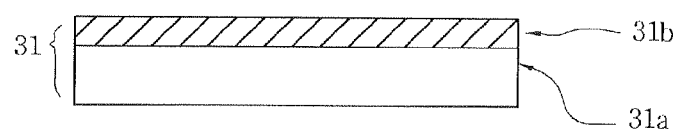

METHOD FOR MANUFACTURING PCB AND PCB MANUFACTURED USING THE SAME

TECHNICAL FIELD

The present invention relates to a Printed Circuit Board (PCB), and, more particularly, to a printed circuit board in which a special-purpose dot circuit and an external circuit are simultaneously formed to improve electrical efficiency, for example by decreasing impedance and electromagnetic waves, and a method of manufacturing the same.

BACKGROUND ART

Generally, a printed circuit board is the most elementary part of various electric and electronic products that have been produced to date, and is widely applied to home electric appliances, such as TVs, VTRs, microwave ovens, desktop computers, notebook PCs and the like, and portable electronic products, such as mobile phones, PDAs, MP3s, and the like. Furthermore, with the rapid development of digital electric and electronic instruments and the advancement of semiconductor technology, small-sized, high-density and high-functional printed circuit boards are increasingly used not only for digital satellite products, DVR monitors, palmtop computers, semiconductor modules, digital cameras, semiconductor testing devices, and automotive parts, but also for high-technology weapons in the defense industry, such as missile warheads, fighter planes, satellites, and the like.

Hereinafter, a conventional method of manufacturing a printed circuit board will be described with reference to the attached drawings.

FIGS. 1 to 6 and 7 to 15 are sectional views illustrating methods of manufacturing conventional one-sided, and double-sided or multi-layered printed circuit boards.

First, a method of manufacturing a conventional one-sided printed circuit board will be described with reference to FIGS. 1 to 6.

FIG. 1 shows a Copper Clad Laminate (CCL) including an insulated substrate 11a and a piece of copper foil 11b applied on the insulated substrate 11a.

Referring to FIG. 2, a dry film 12 including a photosensitizing agent is adhered on the copper foil 11b of the copper clad laminate in order to form a circuit and to be used as an etching resist, and then a circuit 11c is formed through photo exposure and development processes. In addition, the circuit 11c may be formed by circuit-printing and heat-treating (curing) circuit printing ink mixed with a curing agent using a tool referred to as a platemaker.

However, since a circuit formed using circuit printing ink has many electrical and electronic functional problems after part assembly, a process of forming a circuit using a dry film is generally used for quality control.

Referring to FIGS. 3 and 4, the copper foil 11b other than the circuit 11c is etched using the dry film 12, which is developed completely, as an etching resist. Subsequently, an etching resist 12a is removed through a resist stripping process. In this case, a copper chloride solution is chiefly used as an etchant, and a sodium hydroxide solution is chiefly used as a stripping agent.

Referring to FIG. 5, in order to insulate the etched portions of the circuit 11c formed through etching, an insulation layer 13 is formed on the etched portions of the circuit 11c, other than regions in which a surface treatment process will be performed, by performing a commonly-used PSR process (a process of applying an epoxy insulation layer or a polyimide insulation layer on the etched portions of a circuit by printing ink mixed with a photosensitizing agent, heat-treating (partially curing) the printed ink, exposing the heat-treated ink, developing the exposed ink, and then heat-treating (completely curing) the developed ink) or a process of layering a polyimide insulation material thereon.

Referring to FIG. 6, a surface plating layer 14 is formed on the region (SMC PAD or LAND) of the circuit 11c, in which the insulation layer 13 is open, by performing Sn/Pb plating, electroless plating or electrolytic plating in an HSAL (Hot Solder Air Level) process in order to easily perform soldering at the time of part assembly.

Thereafter, a one-sided printed circuit board is completed through post-treatment processes.

Subsequently, a method of manufacturing a conventional double-sided or multi-layered printed circuit board will be described with reference to FIGS. 7 to 15.

FIG. 7 shows a copper clad laminate 21 including an insulated substrate 21a and pieces of copper foil 21b applied on both sides of the insulated substrate 21a.

Referring to FIG. 8, an electroless copper plating process for forming a copper plating layer 22 on the surface of each of the pieces of copper foil 21b and in the holes of each of the pieces of copper foil 21b is performed such that both of the pieces of copper foil 21b are brought into electrical contact with each other after drilling.

Referring to FIG. 9, a dry film 23 including a photosensitizing agent is adhered closely on each of the copper plating layers 22 of the copper clad laminate 21 in order to form a circuit thereon.

Referring to FIG. 10, after the dry film is completely adhered closely on each of the copper plating layers 22, a resist opening 24, in which a circuit will be formed, is formed by performing photo exposure and development processes.

Referring to FIG. 11, an electrolytic copper plating layer 25 is formed in the resist opening 24, in which a circuit will be formed, and then an electrolytic Sn/Pb plating layer 26 is formed on the electrolytic copper plating layer 25.

Here, the electrolytic copper plating layer 25 is formed to a thickness of 15 to 25 □, and the electrolytic Sn/Pb plating layer 26 is formed to a thickness of 7 to 12 □.

Referring to FIG. 12, the dry film 23, which is an electrolytic copper layer resist, is removed through a stripping process, and then a circuit 29 is formed by etching the exposed copper foil using the electrolytic Sn/Pb plating layer 26 as an etching resist. In this case, an alkali etchant is used as an etchant.

Referring to FIG. 13, the electrolytic Sn/Pb plating layer 26, which is an etching resist, is removed through a stripping process.

Referring to FIG. 14, in order to insulate the etched portions of the circuit 29 formed through etching, an insulation layer 27 is formed on the etched portions of the circuit 29, other than regions in which a surface treatment process will be performed at the time of part assembly, by performing a commonly-used PSR process or a process of layering a polyimide insulation material thereon.

Referring to FIG. 15, a surface plating layer 28 is formed on the region (SMC PAD or LAND) of the circuit 29, in which the insulation layer 27 is open, by performing Sn/Pb plating, electroless plating or electrolytic plating in an HSAL (Hot Solder Air Level) process in order to easily perform soldering at the time of part assembly.

Thereafter, a double-sided or multi-layered printed circuit boards is completed through post-treatment processes.

These conventional methods of manufacturing a printed circuit board have a problem in that connectors are connected by assembling the connectors on an SMC pad of a printed circuit board using soldering at the time of part assembly, thus causing various electrical losses, such as the increase of impedance of the printed circuit board and connectors, the decrease of current efficiency due to electromagnetic wave interference, and the like, and thus the conventional methods are of limited usefulness in the manufacture of small-sized, high-density and high-functional products.

DISCLOSURE OF INVENTION

Technical Problem

Accordingly, the present invention has been made to solve the above problems occurring in the prior art, and an object of the present invention is to provide a printed circuit board, in which various special-purpose dot circuits and external circuits can be simultaneously formed, and in which a plating layer having a desired thickness is formed on the dot circuit and the size of the dot circuit can be controlled, and a method of manufacturing the printed circuit board.

Another object of the present invention is to provide a printed circuit board, which can prevent electrical loss, such as the increase of impedance generated between the printed circuit board and connectors, electromagnetic wave interference, and the like, by connecting and contacting the special-purpose dot circuits with electronic parts at the time of part assembly, and which can reduce various costs related to development and quality control, and a method of manufacturing the printed circuit board.

Technical Solution

In order to accomplish the above objects, an aspect of the present invention provides a method of manufacturing a printed circuit board, the printed circuit board including a copper clad laminate that includes an insulated substrate and a piece of copper foil applied on one side of the insulated substrate, including the steps of (a) adhering a dry film including a photosensitizing agent on the copper foil, and then exposing and developing the dry film, thereby forming a dry film opening for forming a dot circuit; (b) forming a copper plating layer by performing electroless or electrolytic plating, and then stripping the dry film, other than the copper plating layer, thereby forming a dot circuit, which is a first metal layer; (c) further adhering a dry film including a photosensitizing agent on the dot circuit, and exposing and developing the dry film, thereby forming an external circuit; and (d) forming a second metal layer by performing electroless or electrolytic plating in order to improve the conductivity of the dot circuit and external circuit.

Another aspect of the present invention provides a method of manufacturing a printed circuit board, the printed circuit board including a copper clad laminate that includes an insulated substrate and pieces of copper foil applied on both sides of the insulated substrate, including the steps of (a) forming first plating layers on the pieces of copper foil by performing electroless copper plating after drilling, and then forming second plating layers on the first plating layers by performing electrolytic plating; (b) adhering dry films on the second plating layers, and then exposing and developing the dry films, thereby forming dot circuit forming portions; (c) forming copper plating layers by performing electrolytic copper plating in the dot circuit forming portions, and then removing the photosensitive dry films other than the copper plating layers through a stripping process, thereby forming dot circuits; (d) further adhering dry films including a photosensitizing agent on the dot circuits, forming etching resists by exposing and developing the dry films, and then forming external circuits by etching the second plating layers; (e) removing the dry films, used as the etching resist, through a stripping process after the formation of the external circuits; and (f) forming second metal layers by performing electroless or electrolytic plating in order to improve the conductivity of the dot circuits and external circuits.

A further aspect of the present invention provides a method of manufacturing a printed circuit board, the printed circuit board including a copper clad laminate that includes an insulated substrate and a piece of copper foil applied on one side of the insulated substrate, including the steps of (a) adhering a dry film including a photo-sensitizing agent on the copper foil, forming an etching resist by exposing and developing the dry film, and then forming an external circuit by etching the copper foil other than portion thereof on which the etching resist is formed; (b) further adhering a dry film including a photosensitizing agent on the external circuit, and then exposing and developing the dry film, thereby forming a dot circuit forming portion; (c) forming a copper plating layer by performing electroless or electrolytic copper plating in the dot circuit forming portion, and then removing the dry film, used as the plating resist, through a stripping process, thereby forming a special purpose dot circuit, which is a first metal layer, on the external circuit; and (d) forming a second metal layer by performing electroless or electrolytic plating in order to improve the conductivity of the dot circuit and external circuit.

A still further aspect of the present invention provides a method of manufacturing a printed circuit board, the printed circuit board including a copper clad laminate including an insulated substrate and pieces of copper foil applied on both sides of the insulated substrate, including the steps of (a) forming first plating layers on the pieces of copper foil by performing electroless copper plating after drilling, and then forming second plating layers on the first plating layers by performing electrolytic plating; (b) adhering dry films including a photosensitizing agent on the second plating layers, and then exposing and developing the dry films, thereby forming etching resists for forming dot circuits; (c) etching the pieces of copper foil other than the etching resists, and then removing the photosensitive dry films, used as the etching resists, through a stripping process, thereby forming external circuits; (d) further adhering dry films including a photosensitizing agent on the external circuit forming dry film openings, in which dot circuits will be formed, by exposing and developing the dry films, and then forming copper plating layers by performing electrolytic plating; (e) removing the dry films through a stripping process, and then forming dot circuits, which are first metal layers, on the external circuits; and (f) forming second metal layers by performing electroless or electrolytic plating in order to improve the conductivity of the dot circuits and external circuits.

Advantageous Effects

As described above, according to the present invention, since various special-purpose dot circuits and external circuits are simultaneously formed through a process of designing and forming the various special-purpose dot circuits, part assembly can be performed using a method of directly connecting and contacting the dot circuits with electronic parts.

Further, since a process of assembling parts by soldering the printed circuit board and connectors is not required, various costs related to development and quality control can be reduced.

Furthermore, since electrical losses, such as the increase of impedance, the decrease of current efficiency, electromagnetic wave interference, and the like, generated due to the connection of connectors at the time of part assembly, can be greatly reduced, the printed circuit board of the present invention can be widely used for small-sized, high-density and high-functional electronic parts and automotive components.

Moreover, since the thickness and size of the dot circuit corresponding to the external circuit can be easily adjusted and various metal plating materials having different electrical characteristics are alternately applied to the printed circuit board, the printed circuit board can be widely used.

As described above, although the preferred embodiments of the present invention have been disclosed for illustrative purposes, those skilled in the art will appreciate that various modifications, additions and substitutions are possible, without departing from the scope and spirit of the invention as disclosed in the accompanying claims.

BRIEF DESCRIPTION OF THE DRAWINGS

FIGS. 1 to 6 are sectional views illustrating a method of manufacturing a conventional one-sided printed circuit board;

FIGS. 7 to 15 are sectional views illustrating a method of manufacturing a conventional double-sided printed circuit board;

FIGS. 16 to 25 are sectional views illustrating a method of manufacturing a one-sided printed circuit board including a special-purpose circuit and an external circuit according to an embodiment of the present invention;

DESCRIPTION OF THE ELEMENTS IN THE DRAWINGS

Figure 8:
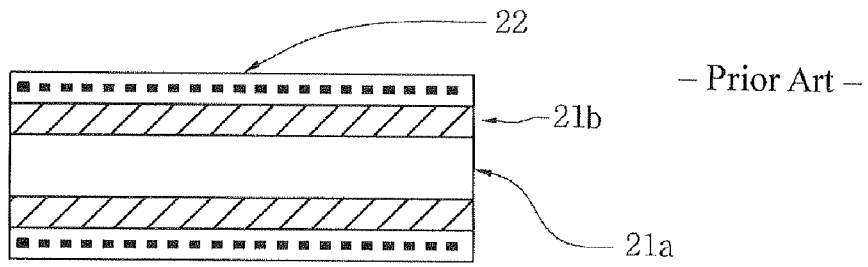
Figure 9:
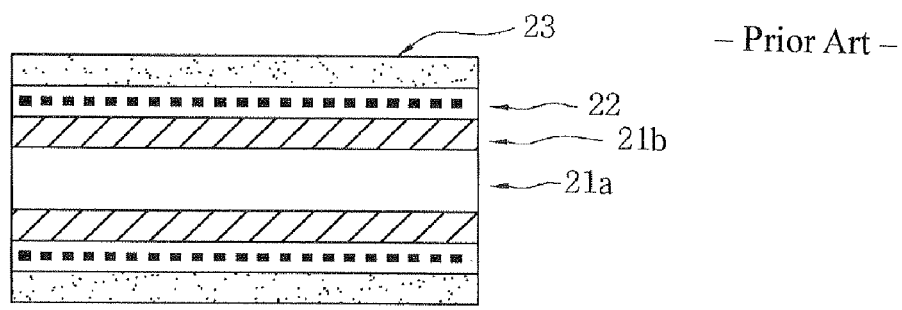
Figure 10:
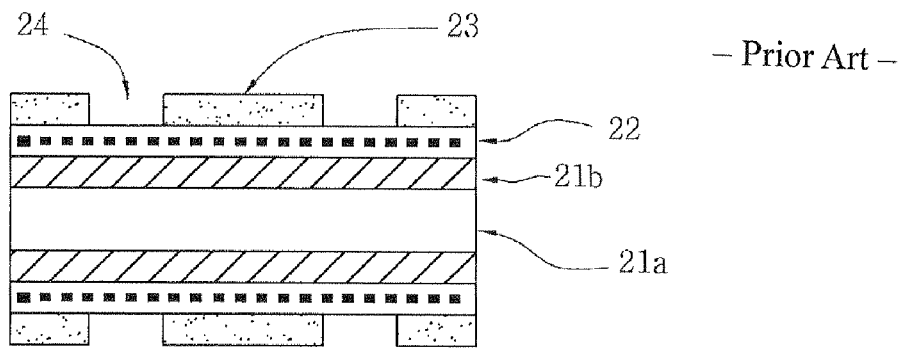
Figure 11:
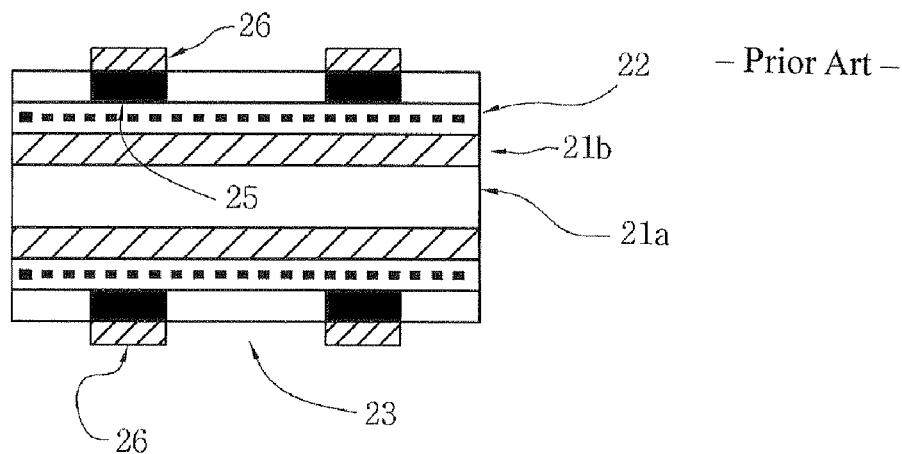

31: copper clad laminate 31a: insulated substrate
31b: copper foil 31c: external circuit
32: dry film 33: dry film opening
34: copper plating layer 34a: dot circuit
35: dry film 36: insulation layer
37: second metal layer 41: copper clad laminate
41a: insulated substrate 41b: copper foil
42: first plating layer 43: second plating layer
43a: external circuit 46: copper plating layer
44: dry film 46a: dot circuit
47: dry film 51: copper clad laminate
51a: insulated substrate 51b: copper foil
51c: external circuit 52: dry film
53: dry film 55a: dot circuit
56: insulation layer 61: copper clad laminate
61a: insulated substrate 61b: copper foil
62: first plating layer 63a: external circuit
63: second plating layer 64: dry film
67a: dot circuit 68: insulation layer
69: second metal layer

BEST MODE FOR CARRYING OUT THE INVENTION

Hereinafter, preferred embodiments of the present invention will be described in detail with reference to the attached drawings. Reference now should be made to the drawings, in which the same reference numerals are used throughout the different drawings to designate the same or similar components.

FIGS. 16 to 25 are sectional views illustrating a method of manufacturing a one-sided printed circuit board, in which a special-purpose circuit and an external circuit are simultaneously formed, according to an embodiment of the present invention.

FIG. 16 shows a Copper Clad Laminate (CCL) including an insulated substrate 31a and a piece of copper foil 31b applied on the insulated substrate 31a.

Figure 17:
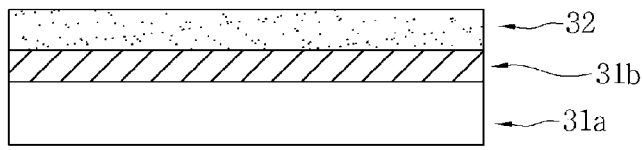

Referring to FIG. 17, a dry film 32 including a photosensitizing agent is adhered on the copper foil 31b of the copper clad laminate 31 in order to form a special-purpose dot circuit thereon. As the dry film 32, including the photosensitizing agent, used in a photo process, LPIs (liquid photo ink) and other photosensitive coating agents may be used.

Figure 18:
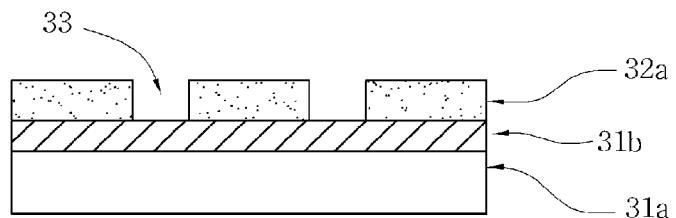

Referring to FIG. 18, after the dry film 32 is completely adhered on the copper foil 31b of the copper clad laminate 31, a dry film opening 33 is formed by photo-exposing and developing the dry film 32 in order to form a dot circuit.

Figure 19:
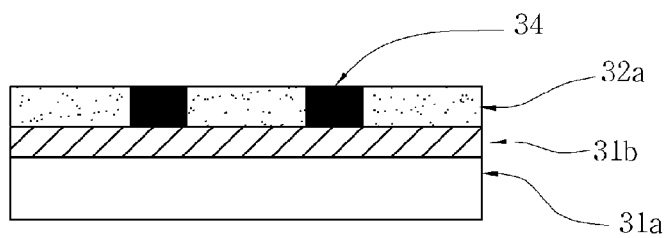

Referring to FIG. 19, a copper plating layer 34 is formed by performing electroless copper plating or electrolytic copper plating in the dry film opening 33 for forming a special-purpose dot circuit. In this case, the copper plating layer 34 may be formed to a thickness of 70 to 80 □, or alternatively may be formed to a thickness less than 70 □ or to a thickness larger than 80 □.

Here, other metal plating materials may be plated in the dry film opening 33 for forming a special-purpose dot circuit.

Figure 20:
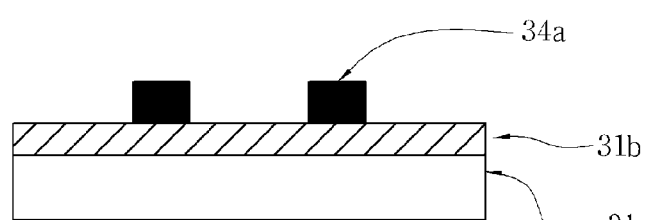

Referring to FIG. 20, the dry film 32a used as a plating resist, except the portion thereof having the copper plating layer 34, in which the special dot circuit is formed, is formed, is removed through a stripping process, and then a dot circuit 34a, which is a first metal layer, is completely formed.

Figure 21:
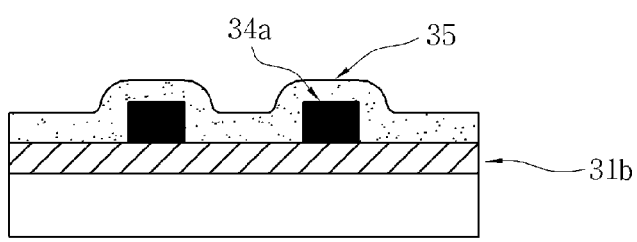

Referring to FIG. 21, a dry film 35 including a photosensitizing agent is further adhered on the dot circuit 34a.

Figure 22:
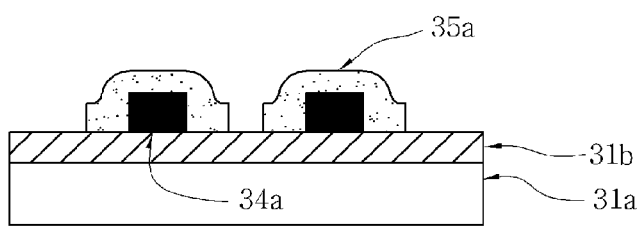

Referring to FIG. 22, after the dry film 35 is further completely adhered on the dot circuit 34a, the center of the dot circuit is accurately aligned to form an external circuit on the formed dot circuit 34a through a photo process, and then an etching resist 35a for the external circuit is formed through exposing and developing processes. In this case, as the dry film 32 including the photosensitizing agent, LPIs (liquid photo ink) and other photosensitive coating agents may be used.

Figure 23:
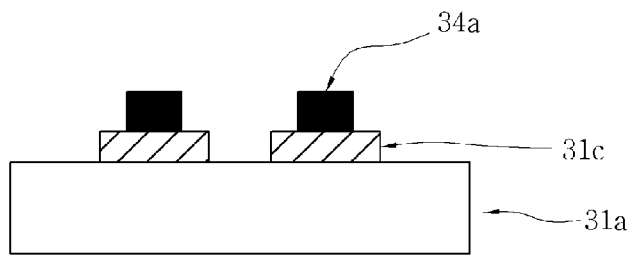

Referring to FIG. 23, the copper foil 31b, except the etching resist 35a formed through a photo process, is etched, and then the photosensitive dry film 35a that was used as the etching resist is removed through a stripping process, thereby simultaneously forming the special-purpose dot circuit 34a and the external circuit 31c.

Figure 24:
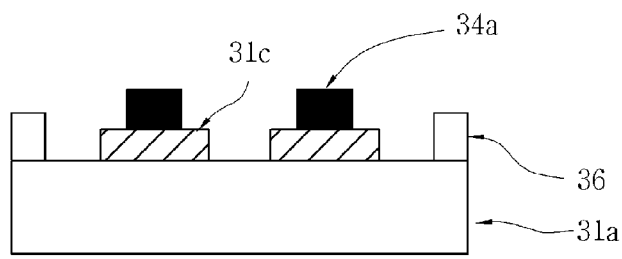

Referring to FIG. 24, in order to insulate the etched portions of the dot circuit 34a and the external circuit 31c, an insulation layer 36 is formed on the etched portions of the dot circuit 34a and the external circuit 31c, other than regions in which a surface treatment process will be performed, by performing a commonly-used PSR process or a process of layering a polyimide insulation material thereon.

Figure 25:
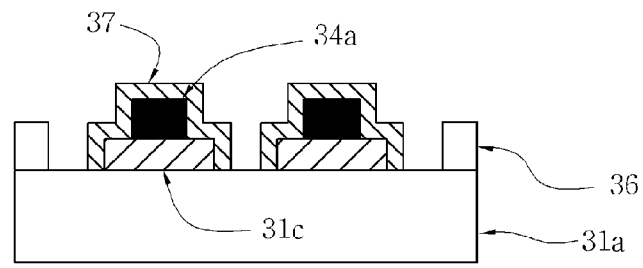

Referring to FIG. 25, in order to improve the conductivity of the simultaneously formed dot circuit 34a and external circuit 31c, a second metal layer 37 is formed by electrolessly or electrolytically plating the dot circuit 34a and external circuit 31c with nickel and/or gold.

In the case where the second metal layer 37 is formed of a nickel plating layer, the second metal layer 37 may be formed to a thickness of 3 to 7 □, or alternatively may be formed to a thickness less than 3 □ or to a thickness larger than 7 □. In the case where the second metal layer 37 is formed of a gold plating layer, the second metal layer 37 may be formed to a thickness of 2.5 to 3.5 □, or alternatively may be formed to a thickness less than 2.5 □ or to a thickness larger than 3.5 □.

Thereafter, a one-sided printed circuit board is completed through post-treatment processes.

FIGS. 26 to 37 are sectional views illustrating a method of manufacturing a double-sided or multi-layered printed circuit board, in which a special-purpose circuit and an external circuit are simultaneously formed, according to an embodiment of the present invention.

Figure 26:
FIGS. 26 to 37 are sectional views illustrating a method of manufacturing a double-sided or multi-layered printed circuit board including a special-purpose circuit and an external circuit according to an embodiment of the present invention.

FIG. 26 shows a Copper Clad Laminate (CCL) including an insulated substrate 41a and pieces of copper foil 41b applied on both sides of the insulated substrate 41a.

Figure 27:
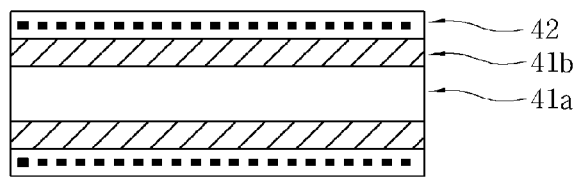

Referring to FIG. 27, first plating layers 42 are formed by performing electroless copper plating such that both of the pieces of copper foil 41b are electrically connected with each other after drilling. In this case, each of the first plating layers 42 may be formed to a thickness of 0.5~1.0 □.

Figure 28:
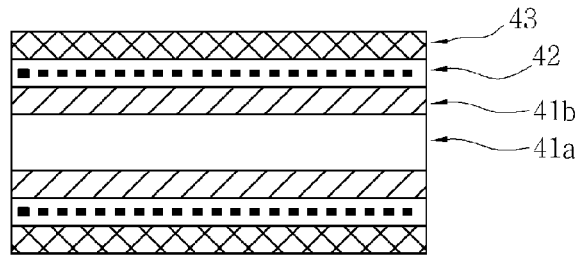

Referring to FIG. 28, second plating layers 43 are formed on the first plating layers 42 by performing electrolytic copper plating. In this case, each of the first plating layers 43 may be formed to a thickness of 15~25 □.

Figure 29:
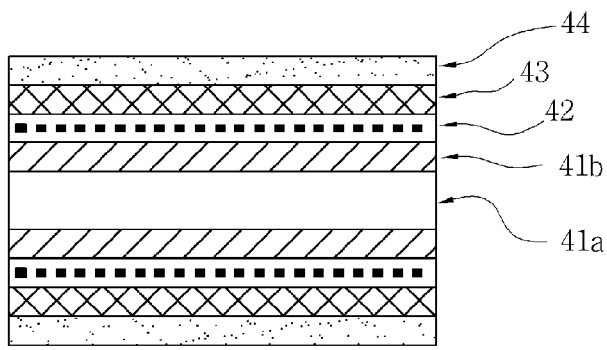

Referring to FIG. 29, a dry film 44 including a photosensitizing agent is adhered on each of the second plating layers 43 of the copper clad laminate 41.

Figure 30:
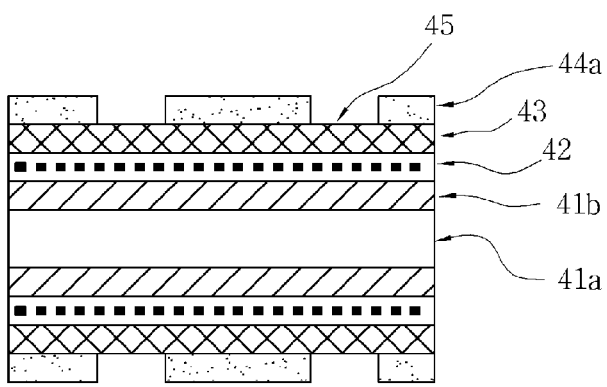

After the dry film 44 is adhered on each of the second plating layers 43, as shown in FIG. 30, a dry film opening 45 is formed in each of the pieces of dry film by exposing and developing the dry film 44 in order to form a dot circuit.

Here, as the dry film 44, including the photosensitizing agent, LPIs (liquid photo ink) and other photosensitive coating agents may be used.

Figure 31:
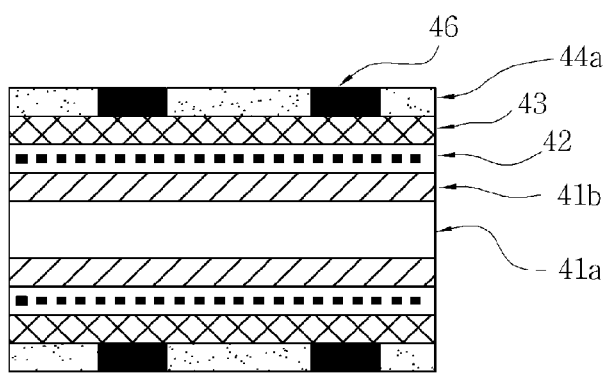

Referring to FIG. 31, a copper plating layer 46 is formed in each of the dry film openings 45, in which special-purpose dot circuits will be formed, by performing electrolytic copper plating.

In this case, the copper plating layer may be formed to a thickness of 70 to 80 □, and may be formed to a thickness less than 70 □ or to a thickness larger than 80 □.

Here, other metal plating materials having different characteristics may be plated in the dry film openings 45, in which special-purpose dot circuits will be formed.

Figure 32:
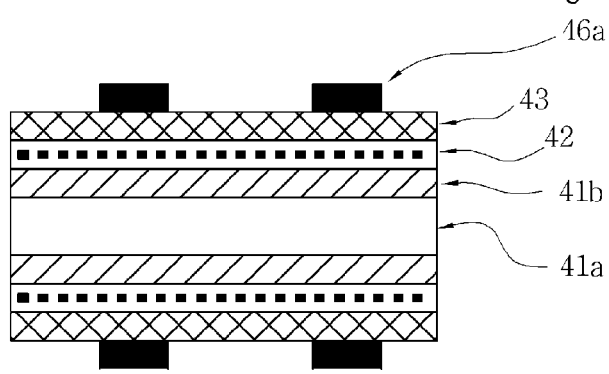

Referring to FIG. 32, the photosensitive dry films 44a used as a plating resist, except the portions thereof in which the copper plating layers 46 for forming the special dot circuit are formed, are removed through a stripping process, and then dot circuits 46a, each of which is a first metal layer, are completely formed.

Figure 33:
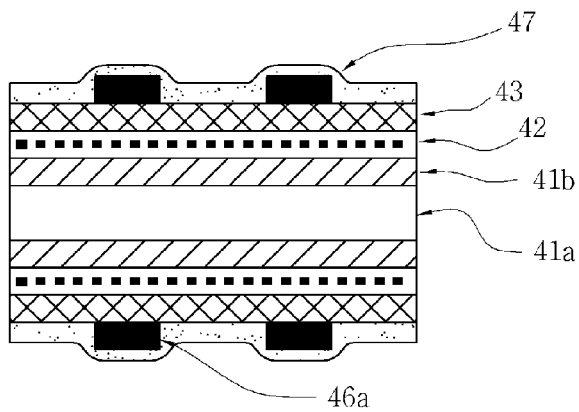

Referring to FIG. 33, a dry film 47 including a photosensitizing agent is further adhered on each of the dot circuits 46a.

Figure 34:
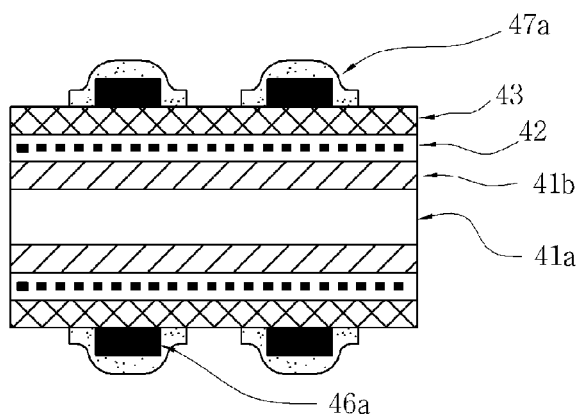

Referring to FIG. 34, after the dry film 47 is completely adhered on each of the dot circuits 46a, the center of each of the dot circuits is accurately aligned to form external circuits on the formed dot circuits 46a through a photo process, and then etching resists 47a for the external circuits are formed through exposing and developing processes.

In this case, as the dry film 47, including the photosensitizing agent, used for forming the external circuits, LPIs (liquid photo ink) and other photosensitive coating agents may be used.

Figure 35:
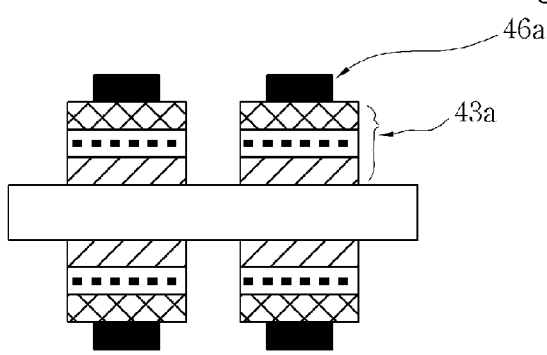

Referring to FIG. 35, external circuits 43a are formed by etching the copper foil 41b, the first plating layer 42 and the second plating layer 43, other than the etching resist 47a formed through a photo process, and then the photosensitive dry films 47a that were used as the etching resist are removed through a stripping process, thereby simultaneously forming the special-purpose dot circuits 46a and the external circuits 43a.

Figure 36:
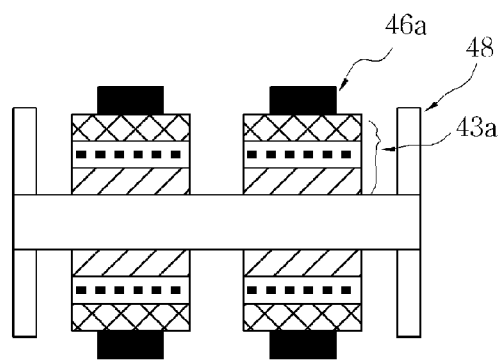

Referring to FIG. 36, in order to insulate the etched portions of the dot circuits 46a and the external circuits 43a, insulation layers 48 are formed on the etched portions of the dot circuits 46a and the external circuits 43a, other than regions in which a surface treatment process will be performed, by performing a commonly-used PSR process or a process of layering a polyimide insulation material thereon.

Figure 37:
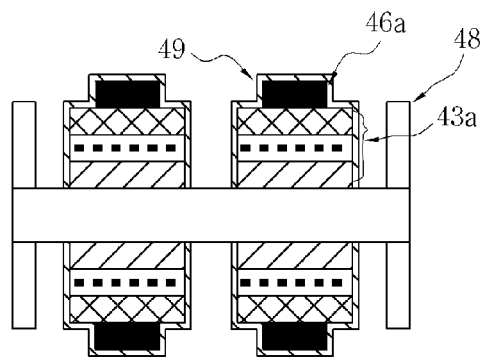

Referring to FIG. 37, in order to improve the conductivity of the simultaneously formed dot circuits 46a and external circuits 43a, second metal layers 49 are formed by electrolessly or electrolytically plating the dot circuits 46a and external circuits 43a with nickel and/or gold. In the case where the second metal layer 49 is formed of a nickel plating layer, the second metal layer 49 may be formed to a thickness of 3 to 7 □, or alternatively may be formed to a thickness less than 3 □ or to a thickness larger than 7 □. In the case where the second metal layer 49 is formed of a gold plating layer, the second metal layer 49 may be formed to a thickness of 2.5 to 3.5 □, or alternatively may be formed to a thickness less than 2.5 □ or to a thickness larger than 3.5 □.

Thereafter, a double-sided or multi-layered printed circuit boards is completed through post-treatment processes.

FIGS. 38 to 47 are sectional views illustrating a method of manufacturing a one-sided printed circuit board, in which a special-purpose circuit and an external circuit are simultaneously formed, according to another embodiment of the present invention.

Figure 38:
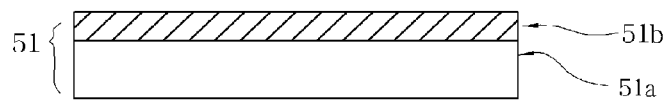
FIGS. 38 to 47 are sectional views illustrating a method of manufacturing a one-sided printed circuit board including a special-purpose circuit and an external circuit according to another embodiment of the present invention.

FIG. 38 shows a Copper Clad Laminate (CCL) including an insulated substrate 51a and a piece of copper foil 51b applied on the insulated substrate 31a.

Figure 39:
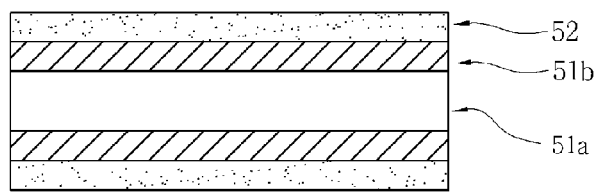

Referring to FIG. 39, a dry film 52 including a photosensitizing agent is adhered on the copper foil 51b of the copper clad laminate 51.

Figure 40:
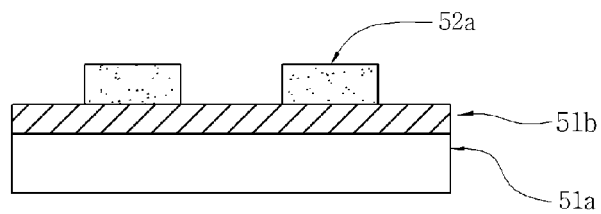

Referring to FIG. 40, after the dry film 52 is adhered on the copper foil 51b, an etching resist 52a is formed through exposing and developing processes in order to form an external circuit.

Here, as the dry film 52, including the photosensitizing agent, used in a photo process, LPIs (liquid photo ink) and other photosensitive coating agents may be used.

Figure 41:
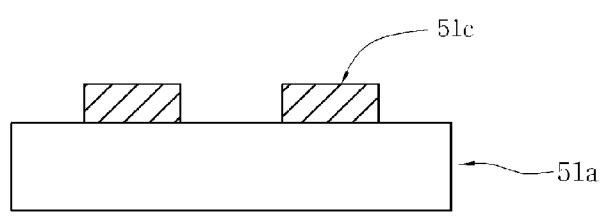

Referring to FIG. 41, a external circuit 51c is formed by etching the copper foil 51b, other than the portion thereof on which the etching resist 52a is formed, and then the photosensitive dry film 52a, used as the etching resist 52a, is removed through a stripping process, thus completing the external circuit 51c.

Figure 42:
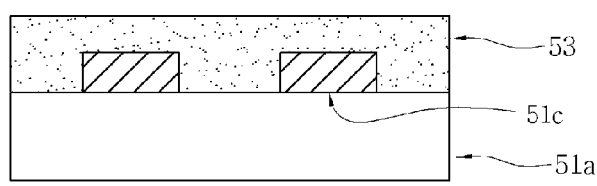
Figure 43:
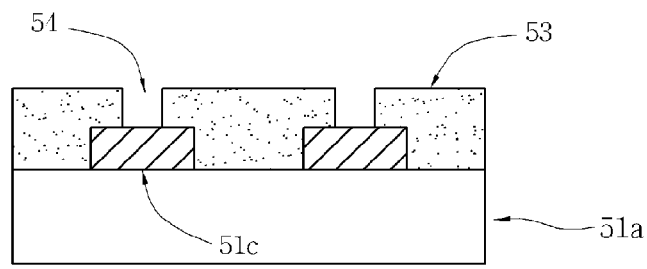

Referring to FIG. 42, after a dry film 53 including a photosensitizing agent is further adhered on the external circuit 51c, as shown in FIG. 43, a dry film opening 54, in which a special-purpose dot circuit will be formed through exposing and developing processes, is formed.

Figure 44:
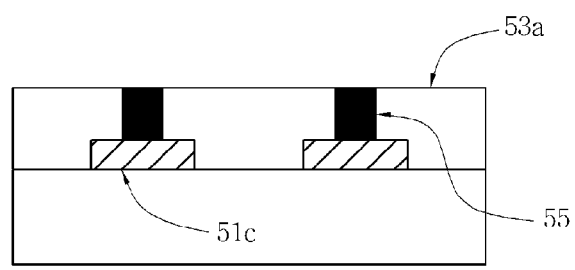

Referring to FIG. 44, a copper plating layer 55 is formed in the dry film opening 54, in which a special-purpose dot circuit will be formed, by performing electroless or electrolytic plating. The copper plating layer 55 may be formed of copper paste through an electroless copper plating process or a printing process.

In this case, the copper plating layer 55 may be formed to a thickness of 70 to 80 □, or alternatively may be formed to a thickness less than 70 □ or to a thickness larger than 80 □.

Here, other metal plating materials may be plated in the dry film opening 54 in which a special-purpose dot circuit will be formed.

Figure 45:
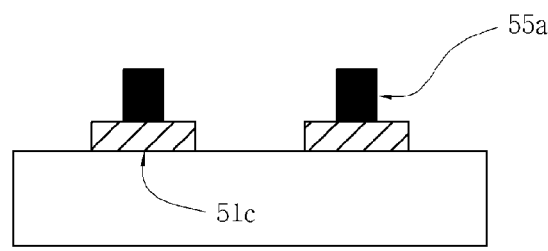

Referring to FIG. 45, a dry film 53a, which has been used as a plating resist, is removed through a stripping process, thereby completing an external circuit 51c and a special-purpose dot circuit 55a, which is a first metal layer.

Figure 46:
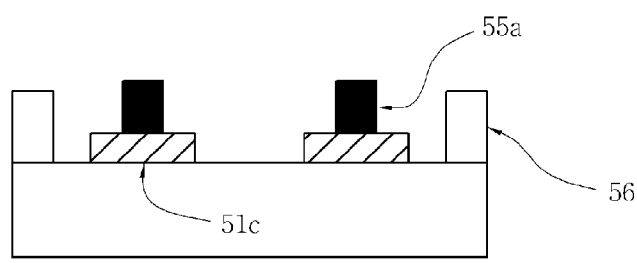
Figure 47:
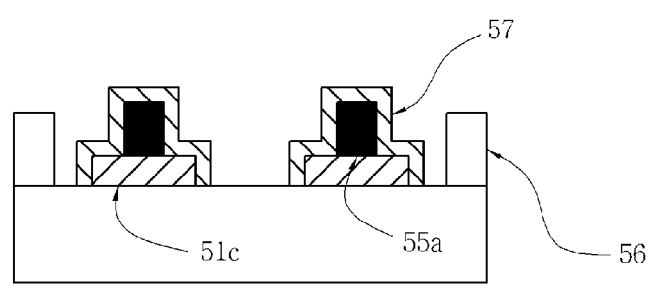

Referring to FIGS. 46 and 47, in subsequent processes, an insulation layer 56 is formed between the circuits, and then a plating layer is formed in order to improve the conductivity of the dot circuit 55a and external circuit 51c. That is, in order to insulate the etched portions of the dot circuit 55a and the external circuits 51c, the insulation layer 56 is formed on the etched portion of the dot circuit 55a and the external circuit 51c, other than the region in which a surface treatment process will be performed, by performing a commonly-used PSR process or a process of layering a polyimide insulation material thereon. Further, in order to improve the conductivity of the dot circuit 55a and external circuit 51c, a second metal layer 57 is formed by electrolessly or electrolytically plating the dot circuit 55a and external circuit 51c with nickel and/or gold.

In the case where the second metal layer 57 is formed of a nickel plating layer, the second metal layer 49 may be formed to a thickness of 3 and 7 □, or alternatively may be formed to a thickness less than 3 □ or to a thickness larger than 7 □. In the case where the second metal layer 57 is formed of a gold plating layer, the second metal layer 57 may be formed to a thickness of 2.5 to 3.5 □, or alternatively may be formed to a thickness less than 2.5 □ or to a thickness larger than 3.5 □.

Thereafter, a one-sided printed circuit board is completed through post-treatment processes.

Figure 48:
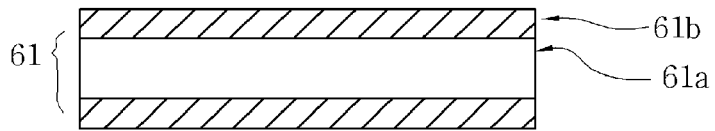
FIGS. 48 to 59 are sectional views illustrating a method of manufacturing a double-sided or multi-layered printed circuit board including a special-purpose circuit and an external circuit according to another embodiment of the present invention.
Figure 49:
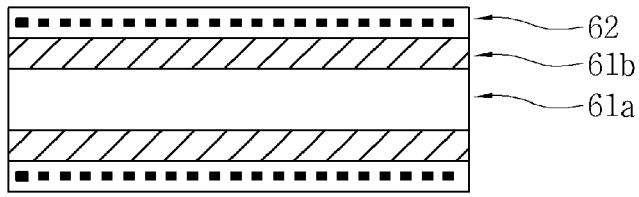

FIGS. 48 to 49 are sectional views illustrating a method of manufacturing a double-sided or multi-layered printed circuit board, in which a special-purpose circuit and an external circuit are simultaneously formed, according to another embodiment of the present invention.

FIG. 48 shows a Copper Clad Laminate (CCL) 61 including an insulated substrate 61a and pieces of copper foil 61b applied on both sides of the insulated substrate 61a.

Referring to FIG. 49, first plating layers 62 are formed by performing electroless copper plating such that both of the pieces of copper foil 61b are electrically connected with each other after drilling. In this case, each of the first plating layers 62 may be formed to a thickness of 0.5~1.0 □.

Figure 50:
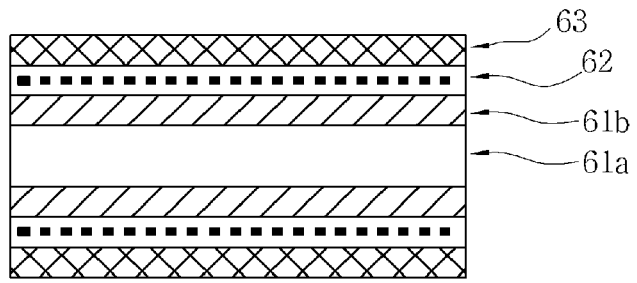

Referring to FIG. 50, second plating layers 63 are formed on the respective first plating layers 62 by performing electrolytic copper plating.

Figure 51:
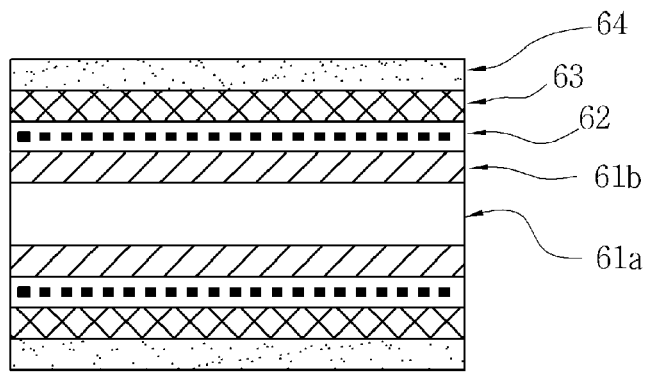

Referring to FIG. 51, a dry film 64 including a photosensitizing agent is adhered on each of the second plating layers 63 of the copper clad laminate 61.

Figure 52:
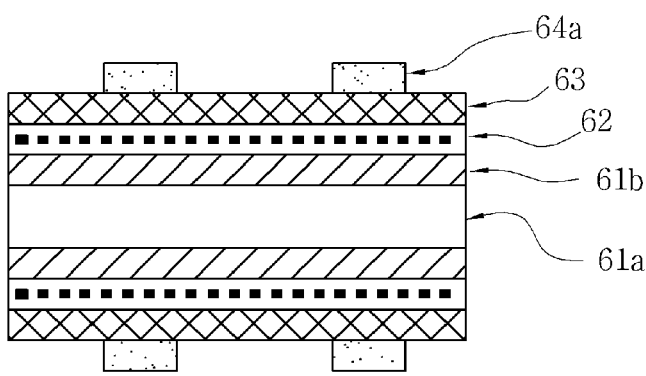

Referring to FIG. 52, after the dry film 64 is adhered on each of the second plating layers 63, etching resists 64a are formed through exposing and developing processes in order to form external circuits.

Here, as the dry film 64, including the photosensitizing agent, which is used to form external circuits, LPIs (liquid photo ink) and other photosensitive coating agents may be used.

Figure 53:
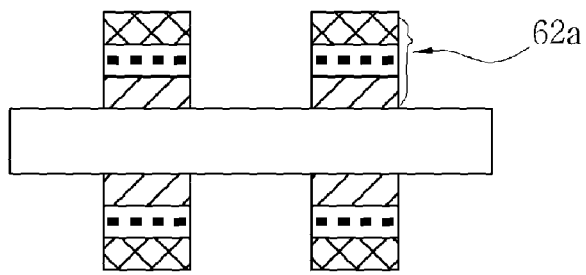

Referring to FIG. 53, external circuits 63a are formed by etching the pieces of copper foil 61b, except the portions thereof on which the etching resists 64a are formed, and then the photosensitive dry film 64, used as the etching resist 64a, is removed through a stripping process, thus completing the external circuits 63a.

Figure 54:
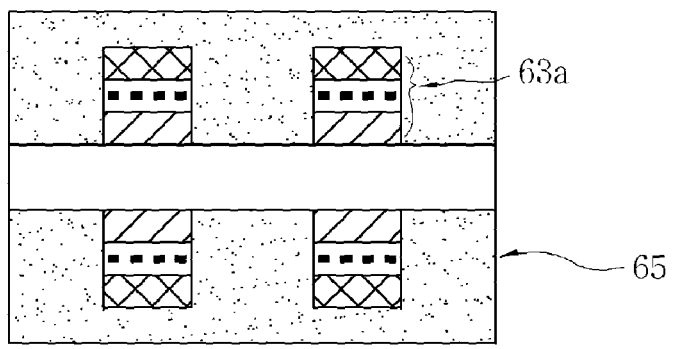

Referring to FIG. 54, a dry film 65 including a photosensitizing agent is further adhered on each of the external circuits 63a.

Figure 55:
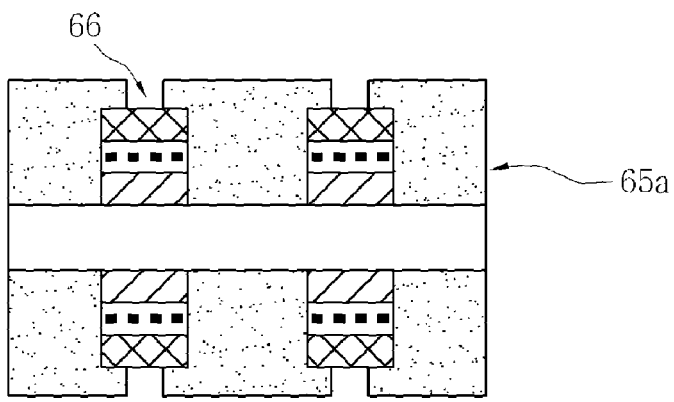

Referring to FIG. 55, after the dry film 65 is further adhered on each of the external circuits 63a, dry film openings 66, in which special-purpose dot circuits will be formed through exposing and developing processes, are formed.

Figure 56:
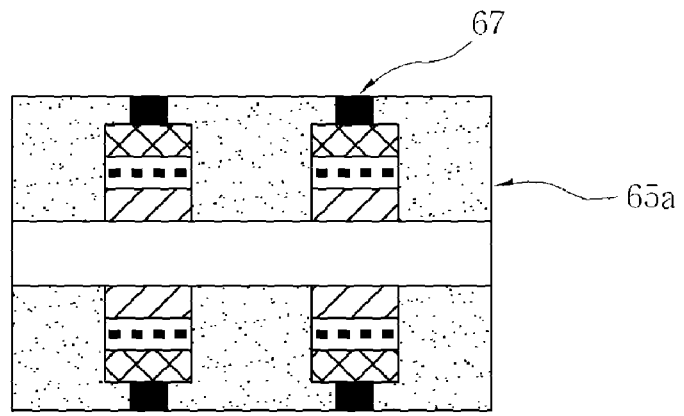

Referring to FIG. 56, copper plating layers 67 are formed in the dry film openings 66, in which special-purpose dot circuits will be formed, by performing electrolytic plating. The copper plating layers 67 may be formed of copper paste through an electroless copper plating process or a printing process.

Here, the copper plating layer 67 may be formed to a thickness of 70 to 80 □, or may alternatively be formed to a thickness less than 70 □ or to a thickness larger than 80 □.

Here, other metal plating materials may be plated in the dry film openings 66 in which special-purpose dot circuits will be formed.

Figure 57:
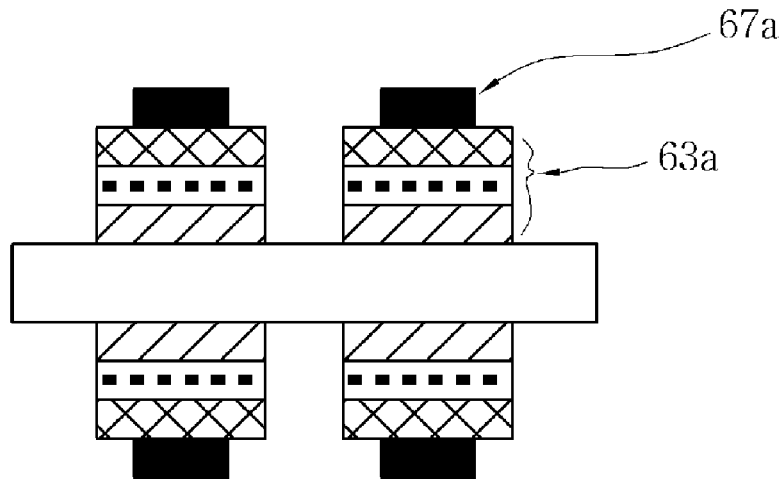

Referring to FIG. 57, dry films 65a, which have been used as a plating resist, are removed through a stripping process, thereby completing external circuits 63a and special-purpose dot circuits 67a, which are first metal layers.

Figure 58:
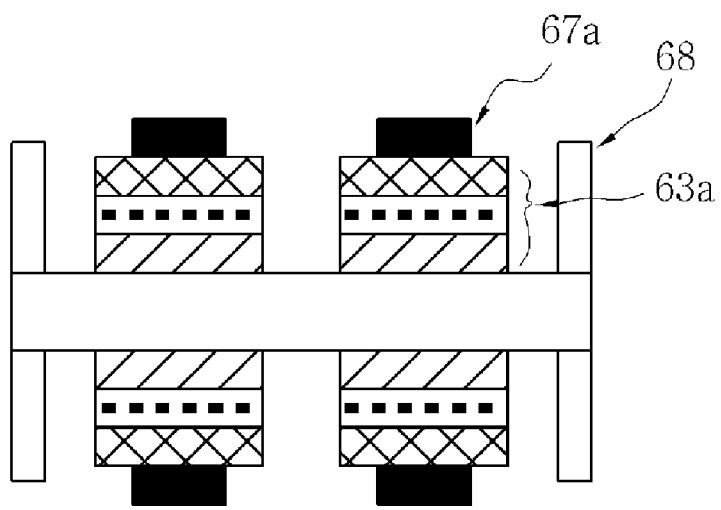

Subsequently, referring to FIG. 58, in a process of forming insulation layers 68 and plating layers 69, the insulation layers 68 are formed on the etched portions of the dot circuits 67a and the external circuits 63a, other than regions in which a surface treatment process will be performed, by performing a commonly-used PSR process or a process of layering a polyimide insulation material thereon.

Figure 59:
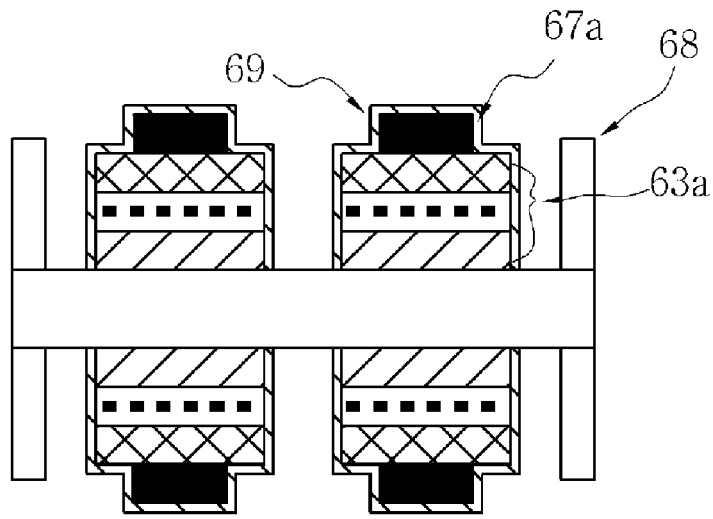

Referring to FIG. 59, in order to improve the conductivity of the special-purpose dot circuits 67a and external circuits 63a, second metal layers 69 are formed by electrolessly or electrolytically plating the dot circuits 67a and external circuits 63a with nickel and/or gold. In the case where the second metal layer 57 is formed of a nickel plating layer, the second metal layer 49 may be formed to a thickness of 3 to 7 □, or may alternatively be formed to a thickness less than 3 □ or to a thickness larger than 7 □ or more. In the case where the second metal layer 57 is formed of a gold plating layer, the second metal layer 57 may be formed to a thickness of 2.5 to 3.5 □, or may alternatively be formed to a thickness less than 2.5 □ or to a thickness larger than 3.5 □.

Thereafter, a double-sided or multi-layered printed circuit board is completed through post-treatment processes.

INDUSTRIAL APPLICABILITY

A printed circuit board manufactured using the method of manufacturing the printed circuit board according to the present invention is advantageous in that, since various special-purpose dot circuits and external circuits are simultaneously formed through a process of designing and forming the various special-purpose dot circuits, part assembly can be performed using a method of directly connecting and contacting the dot circuits with electronic parts, since a process of assembling parts by soldering the printed circuit board and connectors is not required, various costs related to development and quality control can be reduced, since electrical losses, such as the increase of impedance, the decrease of current efficiency, electromagnetic wave interference, and the like, generated due to the connection of connectors at the time of part assembly, can be greatly reduced, the printed circuit board of the present invention can be widely used for small-sized, high-density and high-functional electronic parts and automotive components, and since the thickness and size of the dot circuit corresponding to the external circuit can be easily adjusted and various metal plating materials having different electrical characteristics can be alternatively applied to the printed circuit board, the printed circuit board can be widely used.

The invention claimed is:

1. A method of manufacturing a printed circuit board, the printed circuit board comprising a copper clad laminate 31 including an insulated substrate 31*a* and a piece of copper foil 31*b* applied on one side of the insulated substrate 31*a*, comprising the steps in order of:
    (a) adhering a dry film 32 including a photosensitizing agent on the copper foil 31*b*, and then exposing and developing the dry film 32, thereby forming a dry film opening 33 for forming a dot circuit;
    (b) forming a copper plating layer 34 by performing electroless or electrolytic plating, and then stripping the dry film 32*a* other than the copper plating layer 34, thereby forming a dot circuit 34*a*, which is a first metal layer;
    (c) further adhering a dry film 35 including a photosensitizing agent on the dot circuit 34*a*, and exposing and developing the dry film 35, and etching the copper foil 31*b*, thereby forming an external circuit 31*c* having a larger width than the dot circuit 34*a*; and
    (d) removing the dry film 35 and forming a second metal layer 37 by performing electroless or electrolytic plating in order to improve conductivity of the dot circuit 34*a* and external circuit 31*c*.

2. The method of manufacturing a printed circuit board according to claim 1, further comprising, before the step (d), the step of (e) forming an insulation layer on an etched portion of the dot circuit 34*a* and external circuit 31*c* by etching the dot circuit 34*a* and the external circuit 31*c* respectively, other than a region in which a surface treatment process will be performed, by performing a PSR process or a process of layering a polyimide insulation material.

3. The method of manufacturing a printed circuit board according to claim 1, wherein the dot circuit is composed of copper.

4. The method of manufacturing a printed circuit board according to claim 1, wherein the second metal layer is composed of nickel (Ni) or gold (Au).

5. A method of manufacturing a printed circuit board, the printed circuit board comprising a copper clad laminate 41 including an insulated substrate 41*a* and pieces of copper foil 41*b* applied on both sides of the insulated substrate 41*a*, comprising the steps in order of:
    (a) forming first plating layers 42 on the pieces of copper foil 41*b* by performing electroless copper plating after drilling, and then forming second plating layers 43 on the first plating layers 42 by performing electrolytic plating;
    (b) adhering dry films 44 on the second plating layers 43, and then exposing and developing the dry films 44, thereby forming dot circuit forming portions 45;
    (c) forming copper plating layers 46 by performing electrolytic copper plating in the dot circuit forming portions 45, and then removing the photosensitive dry films 44 other than the copper plating layers 46 through a stripping process, thereby forming dot circuits 46*a*;
    (d) further adhering dry films 47 including a photosensitizing agent on the dot circuits 46*a*, forming etching resists 47*a* by exposing and developing the dry films 47, and then forming external circuits 43*a* having a larger width than the dot circuits 46*a* by etching the second plating layers 43;
    (e) removing the dry films 47*a*, used as the etching resist, through a stripping process after formation of the external circuits 43*a*; and
    (f) forming second metal layers 49 by performing electroless or electrolytic plating in order to improve conductivity of the dot circuits 46*a* and external circuits 43*a*.

6. The method of manufacturing a printed circuit board according to claim 5, further comprising, before the step (f), the step of (g) forming insulation layers 48 on etched portions of the dot circuits 46*a* and external circuits 43*a*, other than regions in which a surface treatment process will be performed, by performing a PSR process or a process of layering a polyimide insulation material.

* * * * *